(12) United States Patent
Orsley

(10) Patent No.: US 11,402,623 B2
(45) Date of Patent: Aug. 2, 2022

(54) FLEXIBLE SUBTRATE AND CIRCUIT FOR LIQUID LENS SYSTEM

(71) Applicant: CORNING INCORPORATED, Corning, NY (US)

(72) Inventor: Timothy James Orsley, San Jose, CA (US)

(73) Assignee: Corning Incorporated, Corning, NY (US)

( * ) Notice: Subject to any disclaimer, the term of this patent is extended or adjusted under 35 U.S.C. 154(b) by 372 days.

(21) Appl. No.: 16/634,732

(22) PCT Filed: Aug. 2, 2018

(86) PCT No.: PCT/US2018/044927
§ 371 (c)(1),
(2) Date: Jan. 28, 2020

(87) PCT Pub. No.: WO2019/028207
PCT Pub. Date: Feb. 7, 2019

(65) Prior Publication Data
US 2020/0201025 A1 Jun. 25, 2020

Related U.S. Application Data

(60) Provisional application No. 62/540,302, filed on Aug. 2, 2017.

(51) Int. Cl.
*G02B 26/00* (2006.01)
*G02B 3/00* (2006.01)
(Continued)

(52) U.S. Cl.
CPC ......... *G02B 26/005* (2013.01); *G02B 3/0056* (2013.01); *G02B 3/12* (2013.01); *H05K 1/028* (2013.01); *H05K 1/118* (2013.01)

(58) Field of Classification Search
CPC ...... G02B 26/005; G02B 3/0056; G02B 3/12; G02B 3/14; H05K 1/028; H05K 1/118
See application file for complete search history.

(56) References Cited

U.S. PATENT DOCUMENTS 6,756,503 B2  6/2004 Teles et al.
7,209,280 B2  4/2007 Goossens
(Continued)

FOREIGN PATENT DOCUMENTS

EP  1296968 A1  4/2003
EP  1939150 A1  7/2008
(Continued)

OTHER PUBLICATIONS

International Search Report and Written Opinion of the International Searching Authority; PCT/US18/44927; dated Oct. 16, 2018; 10 Pages; ISA/US Commissioner for Patents.
(Continued)

*Primary Examiner* — James C. Jones

(57) ABSTRACT

A flexible-substrate circuit for a liquid lens, a liquid lens system, and a method of making a liquid lens system are provided. The system can include a plate having an array of wells and a flexible-substrate circuit. The flexible-substrate circuit can have a longitudinal portion disposed on ridges of the plate, between wells of the plate, and a wing portions transverse to the longitudinal portion that extend into the wells, bonded to walls of the corresponding wells. The wing portion have a first electrode and a second electrode electrically connected to a controller via the longitudinal portion.

20 Claims, 10 Drawing Sheets

(51) Int. Cl.
  *G02B 3/12* (2006.01)
  *H05K 1/02* (2006.01)
  *H05K 1/11* (2006.01)

(56) References Cited

U.S. PATENT DOCUMENTS

| | | |
|---|---|---|
| RE39,874 E | 10/2007 | Berge et al. |
| 7,324,287 B1 | 1/2008 | Gollier |
| 7,443,596 B1 | 10/2008 | Berge |
| 7,469,692 B2 | 12/2008 | Dea et al. |
| 7,515,350 B2 | 4/2009 | Berge et al. |
| 7,548,377 B2 | 6/2009 | Berge |
| 7,573,646 B2 | 8/2009 | Craen et al. |
| 7,616,737 B2 | 11/2009 | Kuiper et al. |
| 7,675,687 B2 | 3/2010 | Chang |
| 7,701,642 B2 | 4/2010 | Obinata |
| 7,791,814 B2 | 9/2010 | Liogier D'ardhuy et al. |
| 7,791,815 B2 | 9/2010 | Weikart et al. |
| 7,808,717 B2 | 10/2010 | Kuiper et al. |
| 7,940,467 B2 | 5/2011 | Berge et al. |
| 8,260,129 B2 | 9/2012 | Craen et al. |
| 8,398,282 B2 | 3/2013 | Kuhlman et al. |
| 8,400,558 B2 | 3/2013 | Berge et al. |
| 8,649,102 B2 | 2/2014 | Berge et al. |
| 9,041,999 B2 | 5/2015 | Bae et al. |
| 9,201,174 B2 | 12/2015 | Karam et al. |
| 2001/0017985 A1 | 8/2001 | Tsuboi et al. |
| 2009/0225400 A1 | 9/2009 | Ansems et al. |
| 2009/0257111 A1* | 10/2009 | Heikenfeld ............ G02B 5/045 427/108 |
| 2010/0149651 A1 | 6/2010 | Berge et al. |
| 2010/0309560 A1 | 12/2010 | Dharmatilleke et al. |
| 2011/0211262 A1 | 9/2011 | Craen et al. |
| 2014/0253870 A1* | 9/2014 | Jiang ...................... G02C 7/085 359/666 |

FOREIGN PATENT DOCUMENTS

| | | |
|---|---|---|
| EP | 2009468 A1 | 12/2008 |
| JP | 2006145807 A | 6/2006 |
| KR | 10-2013-0024102 A | 3/2013 |
| TW | 201319662 A | 5/2013 |
| WO | 02/02544 A1 | 1/2002 |
| WO | 2006/061753 A1 | 6/2006 |
| WO | 2018200916 A1 | 11/2018 |

OTHER PUBLICATIONS

Ouilliet et al; "Electrowetting: a Recent Outbreak"; Current Opinion in Colloid & Interface Science 6, 34-39 (2001).

* cited by examiner

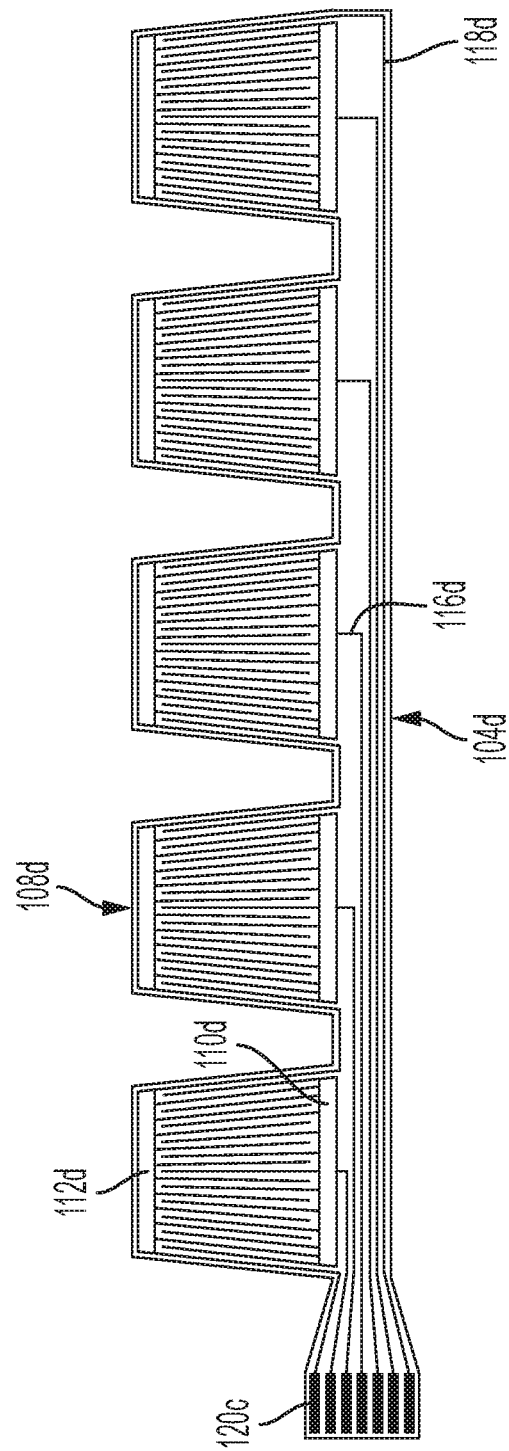

US 11,402,623 B2

FLEXIBLE SUBTRATE AND CIRCUIT FOR LIQUID LENS SYSTEM

CROSS-REFERENCE TO RELATED APPLICATIONS

This application claims the benefit of priority under 35 U.S.C. § 371 of International Application No. PCT/US2018/044927, filed on Aug. 2, 2018, which claims the benefit of priority of U.S. Provisional Application Ser. No. 62/540,302, filed on Aug. 2, 2017, the contents of each of which are relied upon and incorporated herein by reference in their entirety as if fully set forth below.

FIELD

Exemplary embodiments of the present disclosure relate to a circuit for a liquid lens, a liquid lens system, and a method of making a liquid lens system. More particularly, exemplary embodiments of the present disclosure relate to a flexible-substrate circuit having a longitudinal portion to be disposed on a plate and a wing portion to be disposed on a well wall of the plate for a liquid lens, a liquid lens system comprising the flexible-substrate circuit and the plate, and a method of making same.

DISCUSSION OF THE BACKGROUND

Liquid lens elements may include a rigid or elastomeric membrane filled with one or more fluids having indices of refraction greater than 1. According to a process of electro wetting, a liquid lens element may have at least two immiscible fluids and a voltage applied to the liquid lens element. A surface tension of the liquid lens element may change as a result of the voltage being applied, bringing about a change in curvature of an interface between the fluids.

The above information disclosed in this Background section is only for enhancement of understanding of the background of the disclosure and therefore it may contain information that does not form any part of the prior art nor what the prior art may suggest to a person of ordinary skill in the art.

SUMMARY

Exemplary embodiments of the present disclosure provide a flexible-substrate circuit for a liquid lens.

Exemplary embodiments of the present disclosure also provide a liquid lens system.

Exemplary embodiments of the present disclosure also provide a method of making a liquid lens system.

Additional features of the disclosure will be set forth in the description which follows, and in part will be apparent from the description, or may be learned by practice of the disclosure.

An exemplary embodiment discloses a flexible-substrate circuit for a liquid lens. The flexible-substrate circuit includes at least one longitudinal portion extending longitudinally and at least one wing portion disposed on each longitudinal portion. The at least one wing portion extends transverse to the longitudinal portion. Each longitudinal portion is configured to be disposed on a multi-well plate adjacent to at least one well of the multi-well plate with the at least one wing portion configured to extend into a corresponding well and to be disposed on a wall of the corresponding well. Each wing portion comprises a first electrode and a second electrode, and the longitudinal portion comprises electrical connectors configured to electrically connect the first electrode and the second electrode to a controller.

Another exemplary embodiment discloses a liquid lens system. The system includes a plate and at least one flexible-substrate circuit. The plate comprises a first major surface and a second major surface opposite the first major surface, and an array of wells having inner surfaces extending inward from the first major surface to a well depth, and the wells having outer surfaces extending outward from the second major surface to form a well bottom spaced apart from the well depth by a bottom thickness. The at least one flexible-substrate circuit comprises a longitudinal portion and at least one wing portion. The longitudinal portion is disposed on the first major surface of the plate adjacent to at least one well of the array of wells, and the at least one wing portion extends transverse to the longitudinal portion. The at least one wing portion extends into a corresponding well of the at least one well, and is disposed on a wall of the corresponding well. In some such embodiments, each wing portion comprises a first electrode and a second electrode, and the first electrode and the second electrode are electrically connected to a controller via the longitudinal portion.

Another exemplary embodiment discloses a method of making a liquid lens system. The method includes providing a plate having a first major surface and a second major surface opposite the first major surface, and an array of wells having inner surfaces extending inward from the first major surface to a well depth, and the wells having outer surfaces extending outward from the second major surface to form a well bottom spaced apart from the well depth by a bottom thickness; disposing at least one longitudinal portion of at least one flexible-substrate circuit on the first major surface adjacent to at least one well of the array of wells. The at least one flexible-substrate circuit comprises at least one wing portion extending transverse to the at least one longitudinal portion, and the at least one wing portion comprises a first electrode and a second electrode. The method includes disposing the at least one wing portion into a corresponding well; disposing the at least one wing portion on a wall of the corresponding well; and electrically connecting, via the at least one longitudinal portion, the first electrode and the second electrode to a controller.

It is to be understood that both the foregoing general description and the following detailed description are exemplary and explanatory and are intended to provide further explanation of the disclosure.

BRIEF DESCRIPTION OF THE DRAWINGS

The accompanying drawings, which are included to provide a further understanding of the disclosure and are incorporated in and constitute a part of this specification, illustrate exemplary embodiments of the disclosure, and together with the description serve to explain the principles of the disclosure.

FIG. 11 is a schematic of a detail of a flexible-substrate circuit having wing portions disposed on only one side of the longitudinal portion and having first and second electrodes inter-digitated in the wing portions according to an exemplary embodiment of the disclosure.

DETAILED DESCRIPTION OF THE ILLUSTRATED EMBODIMENTS

Figure 1:
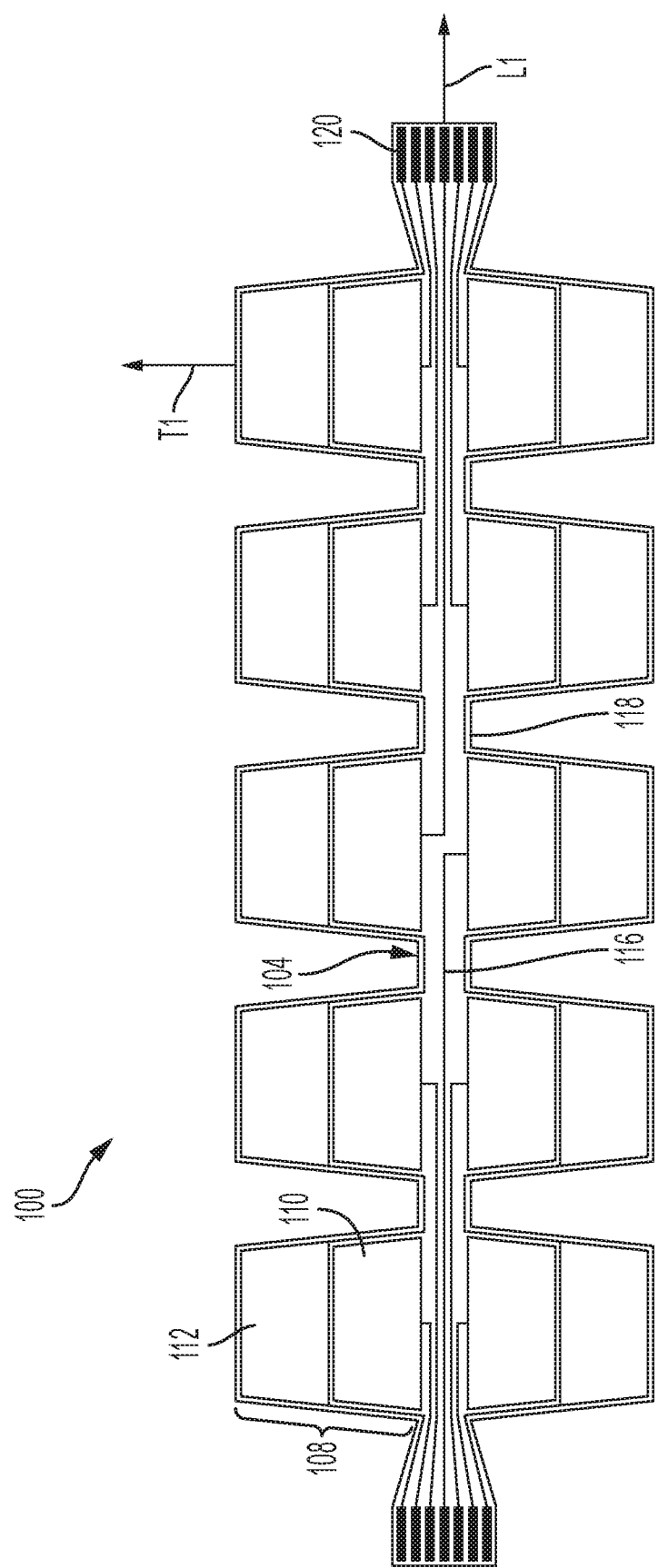
FIG. 1 is a schematic of a flexible-substrate circuit having wing portions disposed in pairs on either side of a longitudinal portion and having first electrodes adjacent the longitudinal portion and second electrodes on the opposite side of the first electrodes from the longitudinal portions in the wing portions according to an exemplary embodiment of the disclosure.

The disclosure is described more fully hereinafter with reference to the accompanying drawings, in which embodiments of the disclosure are shown. This disclosure may, however, be embodied in many different forms and should not be construed as limited to the embodiments set forth herein. Rather, these embodiments are provided so that this disclosure is thorough, and will fully convey the scope of the disclosure to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element or layer is referred to as being "directly on" or "directly connected to" another element or layer, there are no intervening elements or layers present. Electrical connections, connected electrical elements, and the like refer to electrically and operatively connected elements. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Flexible-substrate circuits (e.g., flexible electronics, flex circuits) include electronic circuits of electronic devices or components mounted on a polymer substrate. Flexible-substrate circuits and corresponding electronic assemblies may be manufactured using components used for rigid printed circuit boards, allowing the circuit to conform to a desired shape, or to flex during its use.

According to an exemplary embodiment, the polymer substrate may be a plastic substrate, such as polyimide substrate, polyether ether ketone (PEEK) substrate, transparent conductive polyester film, or the like. In other embodiments, flexible-substrate circuits may include metallic circuitry, such as copper or silver circuits, as may be screen-printed on such a flexible substrate, such as on a flexible polyester substrate. In some embodiments, flexible electronics may be manufactured with use of various etching techniques to thin down a silicon substrate to few tens of micrometers to gain reasonable flexibility, referred to as flexible silicon having about a 5 mm bending radius. In other contemplated embodiments, highly flexible glass sheets may be used as flexible substrates, such as sheets having a thickness of 500 μm or less.

According to an exemplary embodiment, the flexible-substrates are thin, having a thickness less than 2 mm, such as less than 1 mm, such as less than 0.7 mm. In other embodiments the flexible-substrates may be thicker than 2 mm, and may include a highly flexible material. In some contemplated embodiments, the flexible substrate has a flexural strength, according to ASTM D790, of less than 300 MPa, such as less than 200 MPa, such as 150 or less MPa, and/or more than 25 MPa, such as at least 50 MPa. In some contemplated embodiments, the flexible substrate has a flexural modulus of less than 10 GPa, such as 7.5 GPa or less, such as 5 GPa or less, and/or at least 0.5 GPa, such as at least 1 GPa. Applicants have found flexural strength and modulus to facilitate shaping and placement of circuitry as described herein.

In some embodiments only portions of the substrate are flexible, such as hinges between more rigid adjoining portions. In some such embodiments, the hinges are continuously connected to the adjoining portions have a reduced thickness relative thereto to facilitate folding or bending. In some such embodiments, the hinges and the adjoining portions are of a same polymer material, such as the polymers disclosed above.

Applicants believe use of circuitry with flexible substrates may be particularly efficient when constructing liquid lens arrays. The flexible substrates may be used to separately manufacture circuitry for the liquid lens arrays, such as constructing the circuitry on a flat, two-dimensional surface. One constructed, the flexible-substrate circuits may overlay plates with wells with the flexible-substrate circuits and then manufacturers bond these components together. Such a process may be far faster than separate binding individual circuits to wells, or by developing complicated manufacturing equipment and techniques to assemble components with complex geometries, such as circuitry for liquid lens arrays.

An exemplary embodiment of a flexible-substrate circuit 100 for a liquid lens is shown in FIG. 1. The flexible-substrate circuit 100 may include at least one longitudinal portion 104 that extends in a lengthwise or longitudinal direction L1. The flexible-substrate circuit 100 may include at least one wing portion 108 disposed on or extending from the longitudinal portion 104. In some such embodiments, the wing portions 108 may extend transverse or orthogonal to the longitudinal portion 104 in a transverse direction T1 substantially orthogonal to longitudinal direction L1. In some embodiments, the wing portions 108 are separated from the longitudinal portion 104 by a crease or fold 150 (FIG. 6), where the wing portion 108 is oriented an angle θ at least 10 degrees (e.g., at least 15 degrees, at least 30 degrees, and/or no more than 120 degrees, such as no more than 90 degrees) away from (e.g., below) a plane defined by an adjoining portion of the longitudinal portion 104.

According to an exemplary embodiment, the wing portion 108 may include a first electrode 110 and a second electrode 112 coupled thereto. In some such embodiments, the longitudinal portion 104 may include electrical connectors coupled thereto to electrically connect the first and second electrodes 110 and 112 to a controller 310 (FIG. 5). The electrical connectors may include first traces (see FIG. 4 traces 116f, 116g, 116h) to connect the first electrodes 110 (see electrodes 110f, 110g, 110h in FIG. 4) to the controller 310 (see FIG. 5) and second traces (see FIG. 4 traces 118f, 118g, 118h) to connect the second electrodes 112 (see electrodes 112f, 112g, 112h in FIG. 4) to the controller 310 (see FIG. 5). The longitudinal portion 104 may have connection regions (see regions 120f, 120g, 120h in FIG. 4) to connect the first and second electrodes 110 and 112 to the controller 310 (see FIG. 5).

In some embodiments, the first electrode 110 may be an independent control electrode and the second electrode 112 may be a common electrode, or vice versa. In some embodiments, the common electrode may be an independent control electrode. The first traces (see FIG. 4 traces 116f, 116g, 116h) may connect the first electrodes 110 (see electrodes 110f, 110g, 110h in FIG. 4) in parallel (but not to one another) and the second traces (see FIG. 4 traces 118f, 118g, 118h) may connect the second electrodes 112 (see electrodes 112f, 112g, 112h in FIG. 4) in series (to one another). In some embodiments, the first electrode 110 may be closer to the longitudinal portion 104 than the second electrode 112, which may be disposed on an opposite side of the first electrode 110 from the longitudinal portion 104 in at least one wing portion 108 as shown in FIG. 1.

Figure 2:
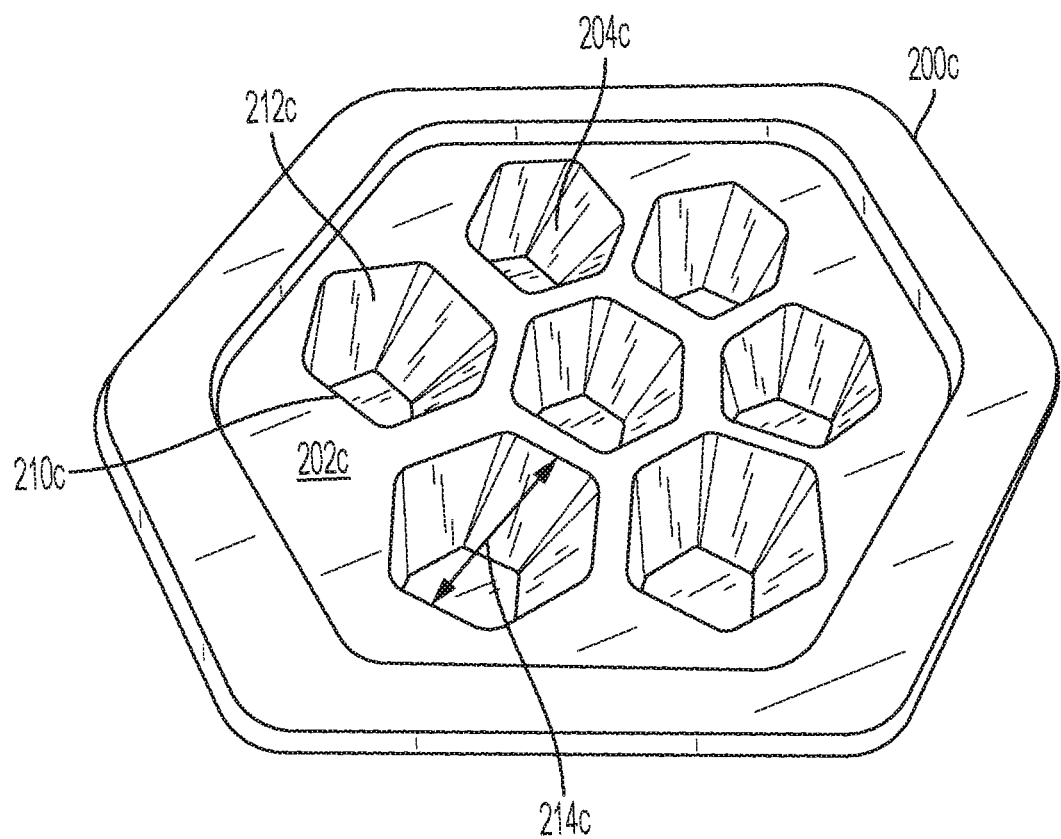
FIG. 2 is a schematic top perspective view and FIG. 3 is a schematic bottom perspective view of a multi-well glass plate that may be made according to methods disclosed herein according to an exemplary embodiment of the disclosure.
Figure 4:
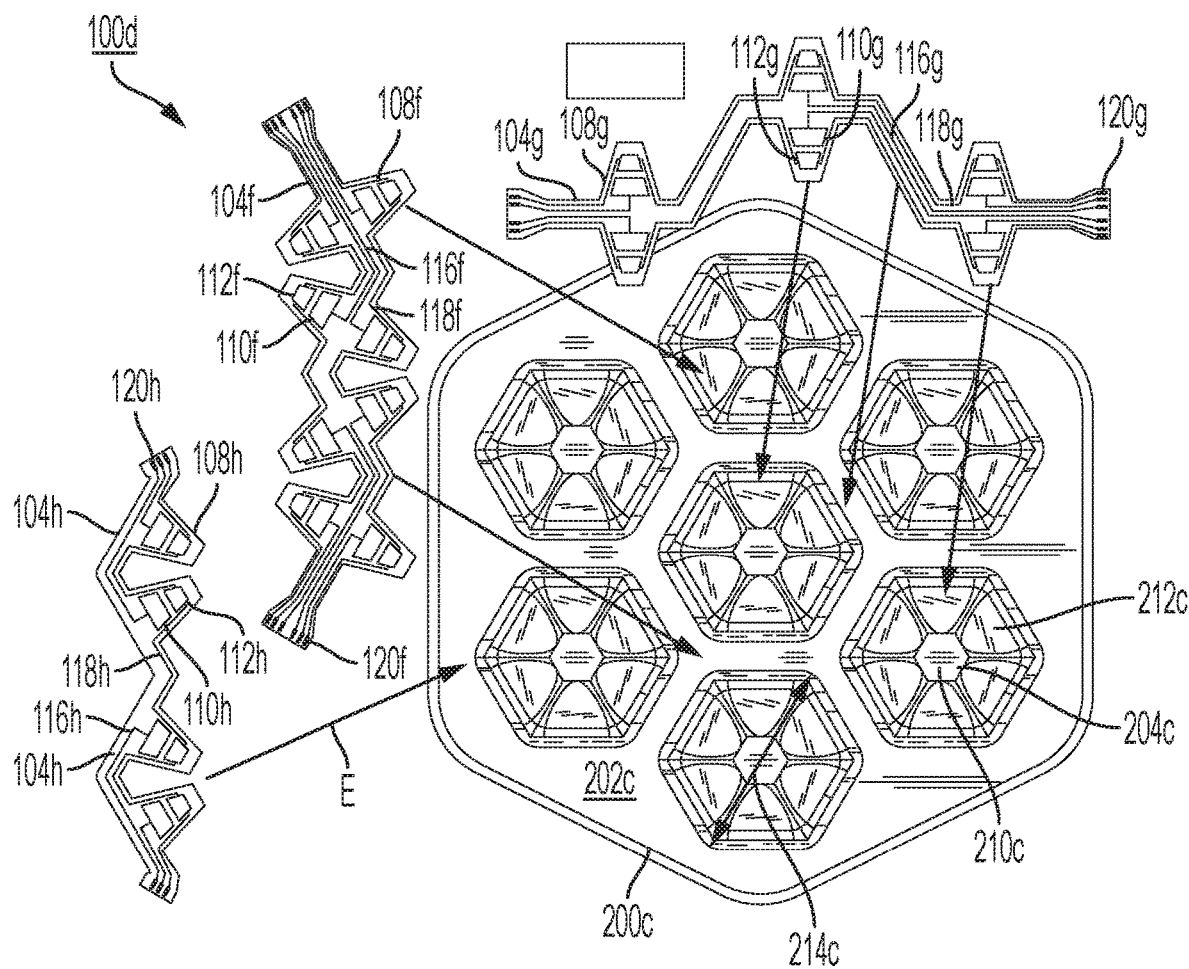
FIG. 4 is a schematic top view of a multi-well plate and a flexible-substrate circuit according to an exemplary embodiment of the disclosure.
Figure 5:
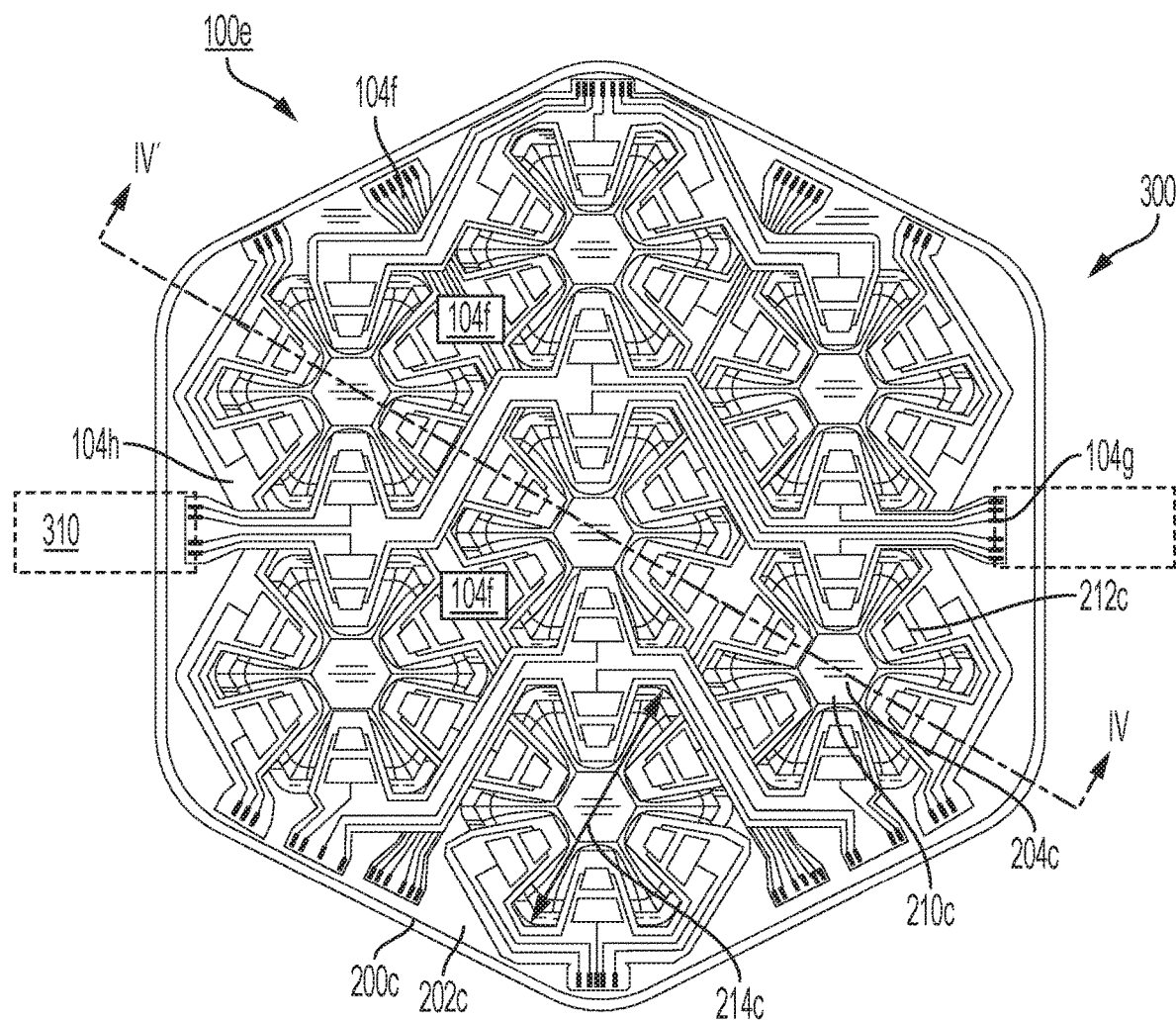
FIG. 5 is a schematic top view of a multi-well plate and a flexible-substrate circuit in a liquid lens system according to an exemplary embodiment of the disclosure.

In FIGS. 2 and 4-5 is a schematic top perspective view of a multi-well plate 200c and a flexible-substrate circuit 100d according to an exemplary embodiment of the disclosure. In some embodiments, the plate 200c may be translucent (e.g., clear or semi-transparent), for example, frosted, tinted, polarized, radiation filtering, and the like, or a combination thereof. The plate 200c may comprise a glass, plastic, or other transparent material, where translucent refers to clear or semi-transparent as just described. For example, the plate 200c may comprise a repressed multi-well glass plate 200. For brevity of description, while in no way intended to be limiting, the plate 200c may be referred to herein as a plate. In contemplated embodiments, only wells of the plate 200c are transparent, or only portions thereof.

As used herein, repressed generally refers to a shaped material such as a flat plate that may or may not have been pressed to be the original shape, such as flat, and then pressed again to imprint another feature in the original shape, such as a non-flat feature in a once flat plate. Such a repressed glass plate as disclosed in U.S. Patent Application No. 62/491,582, filed Apr. 28, 2017, by Boek, et al., the entire contents of which is hereby incorporated by reference as though fully set forth herein, can have desirable properties for various applications. For example, the repressed glass plate may be desirable in a multi-well biological plate, where the optical characteristics of the glass may be particularly important, or when additional components may be included in the well structure, such as electrodes or other thin film devices such as thin film transistors, organic light emitting diodes (OLEDs), or photovoltaics as part of a product, a smooth surface without asperities may be desired. Further, wells encapsulated with an air impermeable seal, such as a hermetic seal, may be desired for long-lived applications such as, but not limited to, displays, lighting, and photovoltaics. Glass that provides surface for sealing processes such as laser welding, O-ring, and frit sealing can be particularly advantageous in this regard. For example, laser welding may require two flat, smooth surfaces to create a near optical contact. Even more attractive may be the ability of the repressed glass plate to provide hermetic seals over electrical leads that may energize active components associated within the wells. In the embodiments of a liquid lens comprising conductors on a flexible-substrate circuit 100, the seal may preferably comprise an epoxy, which may typically not be considered hermetic. However, for a liquid lens, such a seal may not require a hermetic seal.

Figure 6:
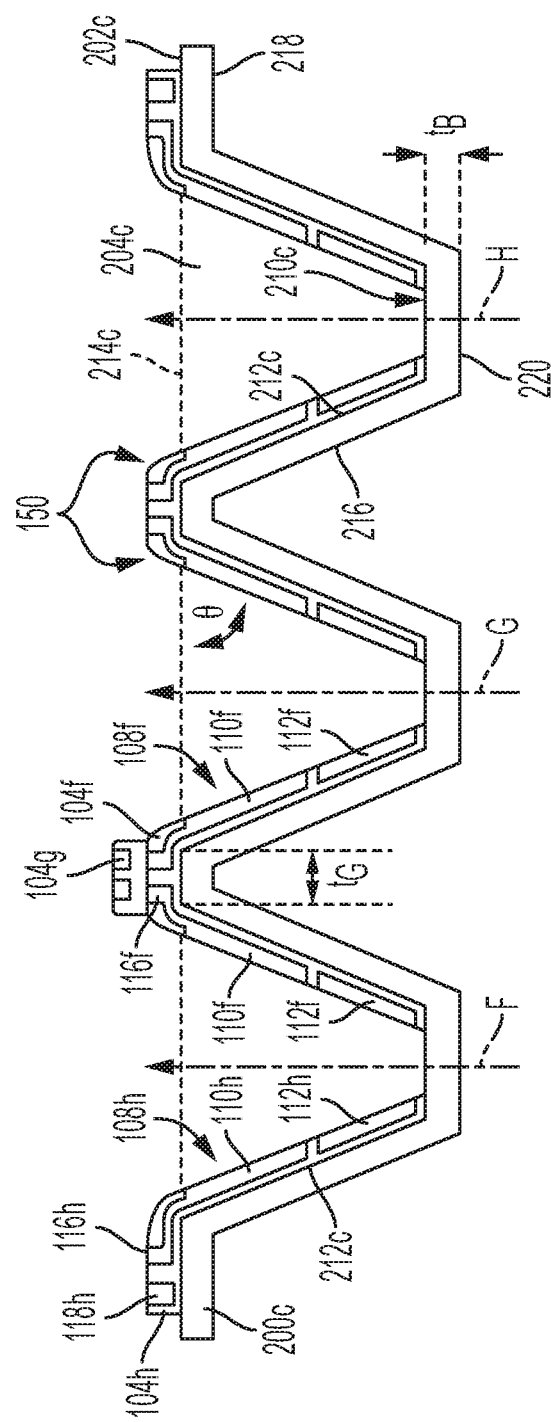
FIG. 6 is a schematic cross-section through the multi-well plate and flexible-substrate circuit in the liquid lens system of FIG. 5 along line IV-IV' according to an exemplary embodiment of the disclosure.

As illustrated in FIG. 4, the longitudinal portion 104h may be disposed on a major surface 202c of the multi-well plate 200c adjacent to at least one well 204c of the multi-well plate 200c with the wing portions 108h extending into corresponding wells 204c and the wing portions 108h to be disposed on the walls 212c (FIG. 6) of the corresponding wells 204c. FIG. 6 shows the longitudinal portion 104g disposed on a spine between adjacent wells 204c with the wing portions 108h, 108f on the well walls 212c. The wing portions 108h, 108f may be glued or otherwise bonded to the well walls 212c. When the wing portions 108h, 108f are disposed on the well walls 212c, the second electrode 112h, 112f may extend to or near a bottom of the corresponding well 204c.

The flexible-substrate circuit 100 (FIG. 1), 100d may be fabricated as a substantially flat part and then the individual wing portions 108 may be folded down into the wells 204c and bonded to the well wall 212c in each well 204c.

Figure 10:
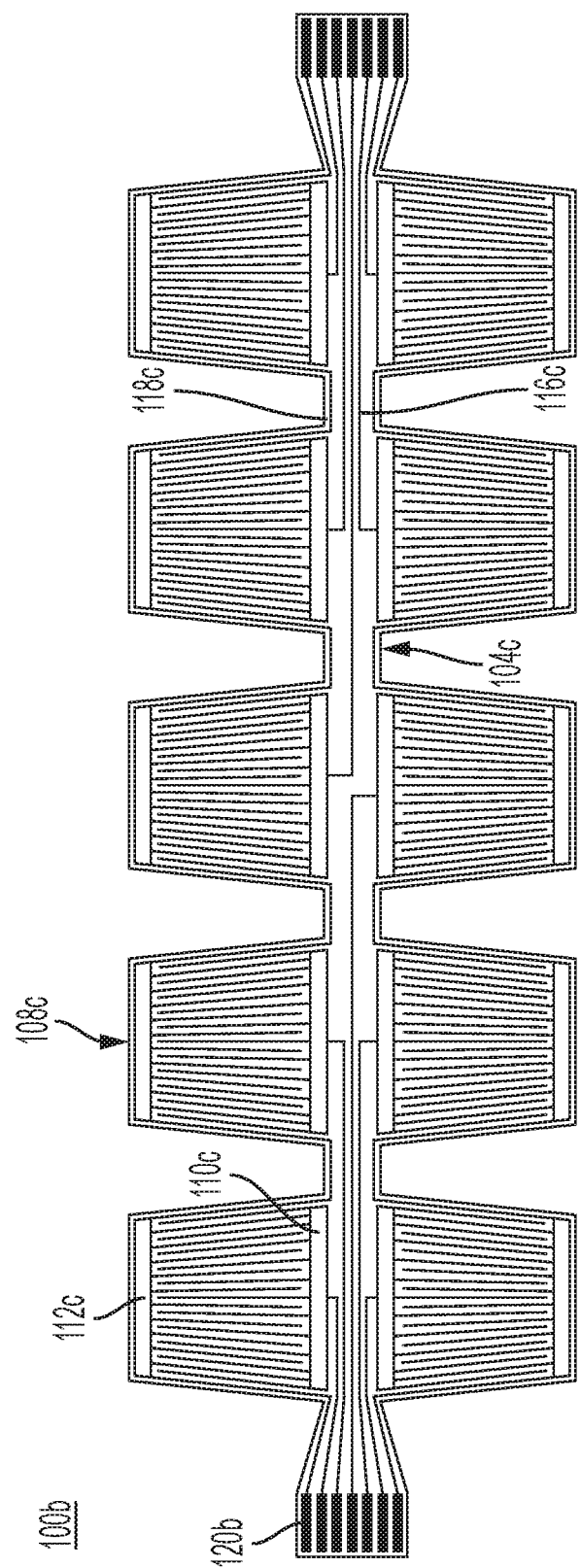
FIG. 10 is a schematic of a detail of a flexible-substrate circuit having wing portions disposed in pairs on either side of the longitudinal portion and having first and second electrodes inter-digitated in the wing portions according to an exemplary embodiment of the disclosure.

FIG. 10 is a schematic of a longitudinal portion 104c of a flexible-substrate circuit 100b having wing portions 108c disposed in pairs on either side of the longitudinal portion 104c and having first and second electrodes 110c and 112c inter-digitated in the wing portions 108c according to an exemplary embodiment of the disclosure. FIG. 11 is a schematic of a longitudinal portion 104d of the flexible-substrate circuit 100b having wing portions 108d disposed on only one side of the longitudinal portion 104d and having first and second electrodes 110d and 112d inter-digitated in the wing portions 108d according to an exemplary embodiment of the disclosure. The longitudinal portions 104c may be disposed between rows or columns of wells so that the wing portions 108c can be disposed on well walls in wells on both sides of the longitudinal portions 104c. Longitudinal portions 104d may be disposed outward and adjacent the outer row or column of wells and wing portions 108d disposed on only one side of the longitudinal portions 104d may extend into the adjacent outer row or column of wells and be disposed on the well walls thereof.

The first traces 116c, 116d may connect the first electrodes 110c, 110d in parallel (but not to one another) via connection region 120b, 120c to a controller and the second traces 118c, 118d may connect the second electrodes 112c, 112d in series via connector region 120b, 120c to the controller, when the first electrodes 110c, 110d and the second electrodes 112c, 112d are inter-digitated in at least one wing portion 108c and 108d.

FIG. 5 is a schematic top view of a liquid lens system 300 including a multi-well plate 200c, flexible-substrate circuits 100d (FIG. 4), a controller 310, and connectors 116h, 116f, 116g connecting the flexible-substrate circuit 100d to the controller 310 according to an exemplary embodiment of the disclosure. As described above, the multi-well plate 200c may comprise a repressed multi-well glass plate. The longitudinal portions 104f, 104g, 104h of the flexible-substrate circuit 100d may be disposed on the major surface 202c of the multi-well plate 200c and the wing portions 108f, 108g, 108h may be disposed on walls of the wells 204c. A cover plate (see plate 404 of FIG. 8) can be sealed to the major surface 202c of the multi-well plate 200c to seal the electrodes of the wing portions in the wells 204c. The longitudinal portions 104f, 104g, 104h may have connector regions 120 (see also 120i of FIG. 8) outside of the seal. The connector regions may operatively and electrically connect the first electrodes and the second electrodes of the flexible-substrate circuit 100d to the controller 310.

Figure 3:
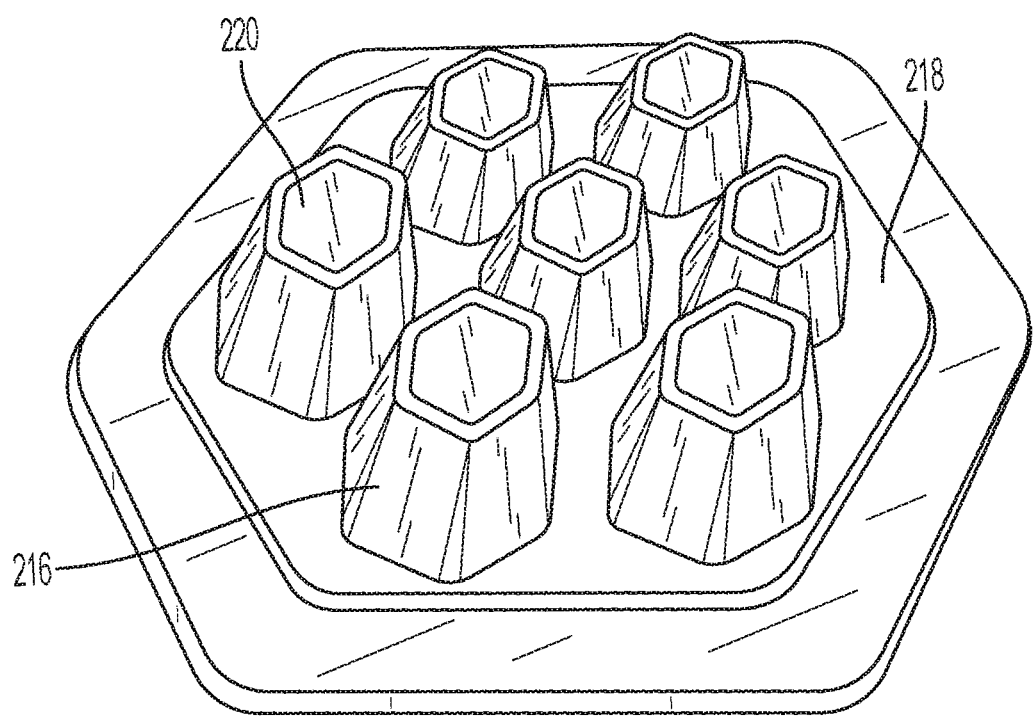

FIG. 2 is a schematic top perspective view and FIG. 3 is a schematic bottom perspective view of a multi-well plate 200c made according to methods disclosed herein according to an exemplary embodiment of the disclosure. In FIG. 2 the plate 200c has a first major surface 202c and seven wells 204c in an array extending into the first major surface 202c to a well depth 210c (e.g., at least 200 µm, such as at least 500 µm, such as at least 1 mm, such as at least 2 mm, and/or less than 2 cm, such as less than 1 cm). The wells 204c have walls 212c that extend from the first major surface 202c to the well depth 210c, and define well openings 214c in the first major surface 202c. The wells 204c may be hexagonal frustums and arranged in a hexagonal array.

The plate 200c can have a plurality of wells 204c or corrugations as shown in FIGS. 2 and 3. For example, the plate 200c can have multiple wells 204c with the wells forming an array of frustums, all of which may have substantially the same wall thickness on surfaces parallel to a reference plane, and thinner on surfaces which are non-parallel to the reference plane. For example, the reference plane can be a major plane of the sheet spaced apart from the wells 204c, for example, major surface 202c. Wall thicknesses parallel to the reference frame can include, for example, the well bottom 220. The well side walls 212c may become thinner when the material was stretched into the multi-well shape. The variation in thickness may depend on the depth of the well relative to the thickness in the reference plane. FIGS. 2 and 3 show an array of such corrugations which have a hexagonal frustum shape. The hexagonal shaped wells can be in a close-packed hexagonal arrangement. Shapes such as hexagonal, pentagonal, triangular, rectangular, and circular frustums are also possible. Where a minimum of space between wells is desired, plane-filling shapes such as hexagons, squares, rectangles, and triangles can be used. The well 204c can have a shape in the form of any of a circular frustum, an oval frustum, an asymmetrical frustum, a symmetrical frustum, a triangular frustum, a rectangular frustum, a hexagonal frustum, another polygonal frustum, or a combination thereof. Further, the well 204c need not be limited to a frustum, for example, the well bottom 220 shape can be flat with sharp or rounded corners at the well wall 212c, or, for example, conical, aspherical, spherical, and cylindrical.

A seven well hexagonal array is shown in FIGS. 2 and 3, however, the number of wells in an array is not particularly limited and can be, for example, 24 arranged in a hexagonal close-packed arrangement. Further, the wells can be arranged in other arrangements, for example, in a square or rectangular array, for example, in a 1×1 array, a 4×4 array, a 15×5 array, a 10×100 array, etc.

The well 204c at the top surface 202c can be spaced apart from an adjacent well by a divider region where well walls 212c meet the top surface 202c. Well walls 212c extend from the top surface 202c spaced apart from well walls of adjacent wells by a gap $t_G$ (FIG. 6). The gap $t_G$ can be at least one wall thickness wide, for example, about 1 mm wide. The gap $t_G$ can prevent cross-talk between wells in applications such as light emitting diodes (LEDs), electrical addressing, and the like. In applications having a shared wall, light and/or current could possibly leak from one well to the adjacent well. However, the gap $t_G$ provides a barrier to cross-talk between adjacent wells. In some instances, the well wall surface can be opaque to guide light out of the well instead of uncontrolled transmission in the well wall.

Outer surfaces 216 of the wells 204c may extend outward from a second major surface 218 opposite the first major surface 202 to form a well underside 220 spaced apart from the inside bottom 210c by a thickness $t_B$ of the bottom (FIG. 6), which may be thicker than walls of the same respective well, such as tB of at least 200 µm, such as at least 500 µm, such as at least 1 mm, such as at least 2 mm, and/or less than 2 cm, such as less than 1 cm.

FIG. 4 is a schematic top view of the multi-well plate 200c shown in FIGS. 2 and 3 and a flexible-substrate circuit 100d according to an exemplary embodiment of the disclosure. The flexible-substrate circuit 100d may have three longitudinal portions 104f, 104g, and 104h. Each longitudinal portion 104f, 104g, 104h may have at least one elbow to accommodate the hexagonal wells 204c and hexagonal arrangement of the wells 204c on the plate 200c when the longitudinal portions 104f, 104g, 104h are disposed on the major surface 202c of the plate 200c as indicated by positioning arrows "E". Longitudinal portions 104f and 104g have opposing pairs of wing portions 108f and 108g transverse to the longitudinal portions 104f and 104g to extend into the adjacent wells 204c on either side of the longitudinal portions 104f and 104g when disposed between rows or columns of wells 204c. Longitudinal portion 104h to be disposed adjacent and outward of the outer periphery of wells 204c has wing portions 108h on only one side of the longitudinal portion 104h to extend into the wells 204c on only one side of the longitudinal portion 104h.

The wing portions 108f, 108g, 108h have first electrodes 110f, 110g, 110h and second electrodes 112f, 112g, 112h and may be disposed on well walls 212c of the corresponding adjacent wells 204c. The first traces 116f, 116g, 116h may connect the first electrodes 110f, 110g, 110h to a controller and second traces 118f, 118g, 118h may connect the second electrodes 112f, 112g, 112h to the controller. A connector region 120f, 120g, 120h of the longitudinal portions 104f, 104g, 104h may provide a connection between the first traces 116f, 116g, 116h and second traces 118f, 118g, 118h in the longitudinal portions 104f, 104g, 104h and the controller.

FIG. 5 is a schematic top view of the multi-well plate 200c and a flexible-substrate circuit 100e in a liquid lens system according to an exemplary embodiment of the disclosure. FIG. 6 is a schematic cross-section through the multi-well plate 200c and flexible-substrate circuit 100e in the liquid lens system of FIG. 5 along line IV-IV' according to an exemplary embodiment of the disclosure. Referring to FIGS. 4, 5, and 6, the well walls 212c all have a wing portion 108f, 108g, 108h disposed thereon. The well depths 210c of the wells 204c and the well openings 214c of the wells 204c at the major surface 202c may be unobstructed by the flexible-substrate circuit 100e such that light indicated by arrows "F", "G", and "H" may pass through the bottoms of the wells 204c and the well openings 214c substantially unobstructed by the wing portions 108f, 108g, 108h and the longitudinal portions 104f, 104g, 104h.

In the liquid lens system, the first electrodes 110f, 110g, 110h may be independently controlled electrodes and the second electrodes 112f, 112g, 112h may be common electrodes or vice versa. The independently controlled electrode refers to an electrode that can be individually controlled. The controller can be connected to the first electrodes 110f, 110g, 110h in independently by the first traces 116f, 116g, 116h in the longitudinal portions 104f, 104g, 104h to individually control the first electrodes 110*f*, 110*g*, 110*h*. The controller can be connected to the second electrodes 112*f*, 112*g*, 112*h* in series by the second traces 118*f*, 1186*g*, 118*h* in the longitudinal portions 104*f*, 104*g*, 104*h* when the second electrodes 112*f*, 112*g*, 112*h* are common electrodes.

In an embodiment of the liquid lens system, the first electrode 110*f*, 110*g*, 110*h* may be adjacent to the longitudinal portion 104*f*, 104*g*, 104*h* and the second electrode 112*f*, 112*g*, 112*h* may be disposed on an opposite side of the first electrode 110*f*, 110*g*, 110*h* from the longitudinal portion 104*f*, 104*g*, 104*h* in at least one wing portion 108*f*, 108*g*, 108*h*. The second electrode 112*f*, 112*g*, 112*h* may extend to or near (e.g., within 25% of the well depth from the inside bottom of the well, such as within 15%) the well depth 210*c* as shown, for example, in the middle well of FIG. 10. In an embodiment of the liquid lens system, the first electrode 110*f*, 110*g*, 110*h* and the second electrode 112*f*, 112*g*, 112*h* may be inter-digitated in at least one wing portion 108*f*, 108*g*, 108*h*. The longitudinal portion 104*f*, 104*g*, 104*h* may be bonded to the first major surface 202*c* on a top of the glass plate 200*c* and the wing portion 108*f*, 108*g*, 108*h* may be bonded to the well wall 212*c*, such as via ultra-violet light curable adhesive, epoxy, or another adhesive or coupling.

Referring to FIG. 5 and FIG. 6, the flexible-substrate circuits 100*e* may include flexible substrates disposed on opposite sides of each well 204*c*. The longitudinal portions 104*f*, 104*g*, 104*h* of the flexible-substrate circuits 100*e* may be disposed parallel to longitudinal portions 104*f*, 104*g*, 104*h* on the opposite side of the well 204*c*, and the wing portions 108*f*, 108*g*, 108*h* may be disposed in each well 204*c* on opposite well walls 212*c* from each other extending from each longitudinal portion 104*f*, 104*g*, 104*h*.

Figure 7:
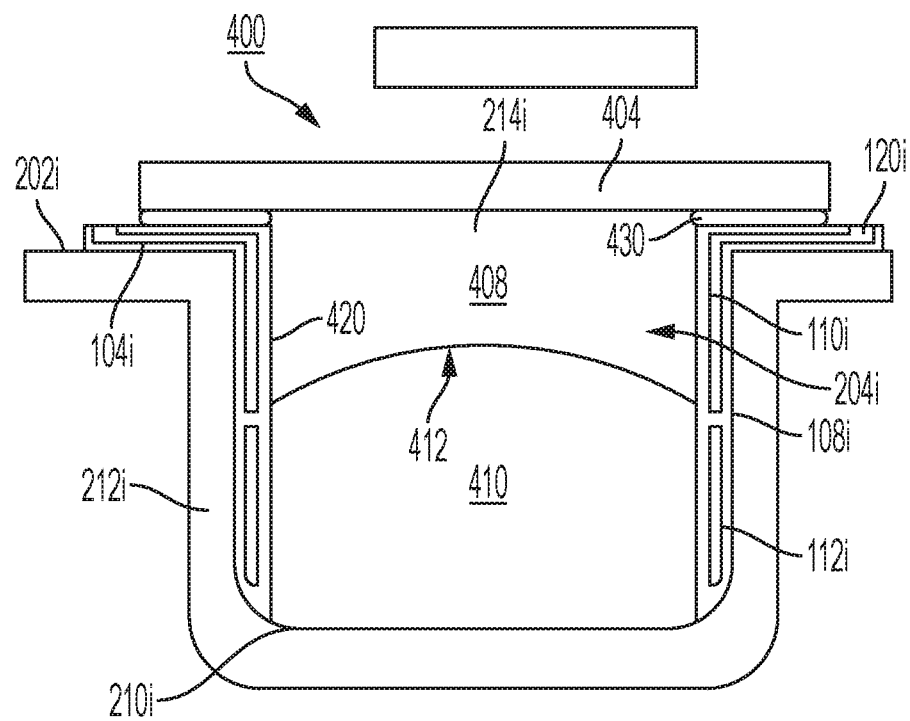
FIG. 7 is a schematic side view and FIG. 8 is a schematic top view of a liquid lens system including a sealed well of a plate, and flexible-substrate circuit according to an exemplary embodiment of the disclosure.
Figure 8:
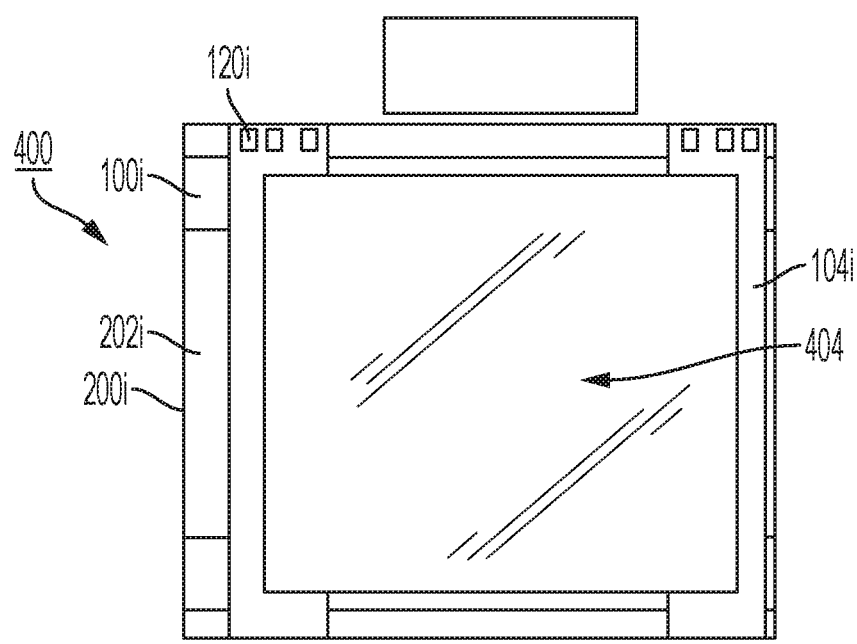

FIG. 7 is a schematic side view and FIG. 8 is a schematic top view of a liquid lens system 400 including a sealed well 204*i* of a plate 200*i*, and flexible-substrate circuits 100*i* according to an exemplary embodiment of the disclosure.

The plate 200*i* can have a first major surface 202*i* and well 204*i* extending into the first major surface 202*i* to a well depth 210*i*. The well 204*i* can have walls 212*i* that extend from the first major surface 202*i* to the well depth 210*i*, and define a well opening 214*i* in the first major surface 202*i*. A flexible-substrate circuit 100*i* can be disposed on the plate 200*i* and include longitudinal portions 104*i* on the major surface 202*i* of the plate 200*i* and wing portions 108*i* extending transverse to the longitudinal portions 104*i* into the well 204*i* where the wing portions 108*i* may be disposed on the well wall 212*i*.

In the liquid lens system 400, a first liquid 408 and a second liquid 410 may be disposed in the well 204*i*. The first and second liquids 408, 410 may be non-miscible in each other. The first and second liquids 408, 410 may be of different optical indexes from each other, and the first and second liquids 408, 410 may be of substantially the same density. The first liquid 408 may be conductive and the second liquid 410 may be insulating. A cover glass 404 may be disposed on a top surface of the glass plate 200*i* on the first major surface 202*i*.

In some of the embodiments of the liquid lens system 400 an insulation layer may be disposed on any of the first electrode 110*i* and the second electrode 112*i* between any of the first and second electrodes 110*i*, 112*i* and any of the first and second liquids 408, 410.

The cover plate 404 can be sealed to the major surface 202*i* of the plate 200*i* to seal the electrodes 110*i*, 112*i* of the wing portions 108*i* in the well 204*i*. The longitudinal portions 104*i* may have connector regions 120*i* outside of the seal to provide electrical control to the electrodes 110*i*, 112*i*.

A separate seal 430 such as an O-ring, glue, silicone, polyimide, epoxy, or the like may be used to seal the cover plate 404 to the major surface 202*i*, the flexible-substrate circuit 100*i* may provide the seal, the cover plate 404 may be sealed directly to the major surface 202*i* by laser welding, glass frit or the like, or a combination thereof may be used to seal the cover plate 404 to the major surface 202*i* sealing the well 204*i*.

Electrical control of the first electrode 110*i* and the second electrode 112*i* may be used to control the shape of the meniscus between the first and second liquids 408, 410 in the well 204*i* and thus the direction and dispersion of light passing through the well 204*i*.

A method of making a liquid lens system according to exemplary embodiments may include providing the plate 200, 200*a-c*, 200*i* having the first major surface 202, 202*a-c*, 202*i* and the second major surface 218 opposite the first major surface 202, 202*a-c*, 202*i*. The plate 200, 200*a-c*, 200*i* may be transparent, semi-transparent, and may even have opaque portions, such as well walls 212, 212*a*, 212*c*, 212*i* as described above. The plate may have the array of wells 204, 204*a-c*, 204*i* having inner surfaces extending inward from the first major surface 202, 202*a-c*, 202*i* to a well depth 210, 210*c*, 210*i*, and the wells 204, 204*a-c*, 204*i* may have outer surfaces extending outward from the second major surface 218 to form the well bottom 220 spaced apart from the well depth 210, 210*c*, 210*i*, by the bottom thickness $t_B$. The method may include disposing at least one of the longitudinal portions 104, 104*a-i* of at least one flexible-substrate circuit 100*e*, 100*i* on the first major surface 202, 202*a-c*, 202*i* adjacent to at least one well 204, 204*a-c*, 204*i* of the array of wells. The at least one flexible-substrate circuit 100-*e*, 100*i* can include the wing portions 108, 108*a-i* extending transverse to the longitudinal portions 104, 104*a-i*, and the wing portions 108, 108*a-i* can include the first electrode 110, 110*a*, 110*c*, 110*d*, 110*f-i* and the second electrode 112, 112*a*, 112*c*, 112*d*, 112*f-i*.

The method may include disposing the wing portion 108, 108*a-i* into the corresponding well 204, 204*a-c*, 204*i*, and disposing the wing portion 108, 108*a-i* on the wall 212, 212*a*, 212*c*, 212*i* of the corresponding well 204, 204*a-c*, 204*i*. The method of making the liquid lens system may include electrically connecting, via the at least one longitudinal portion 104, 104*a-i*, the first electrode 110, 110*a*, 110*c*, 110*d*, 110*f-i* and the second electrode 112, 112*a*, 112*c*, 112*d*, 112*f-i* to the controller 310.

In these embodiments, the method of making the liquid lens system may further include adding the first liquid 408 and the second liquid 410 to the well 204, 204*a-c*, 204*i*. The first liquid 408 may be conductive and contact the first electrode 110, 110*a*, 110*c*, 110*d*, 110*f-i*. The second liquid 410 may have an interface 412 with the first liquid 408, the second liquid 410 may be insulating, and the first and second liquids 408, 410 may be non-miscible. In these embodiments, the method may further include sealing the well 204, 204*a-c*, 204*i*, such that the longitudinal portion 104, 104*a-i* may provide a conductive path through the seal 430.

The method may further include applying a plurality of voltages between the first liquid 408 and the first electrode 110, 110*a*, 110*c*, 110*d*, 110*f-i* to change the shape of the interface 412 between the first liquid 408 and the second liquid 410.

Figure 9:
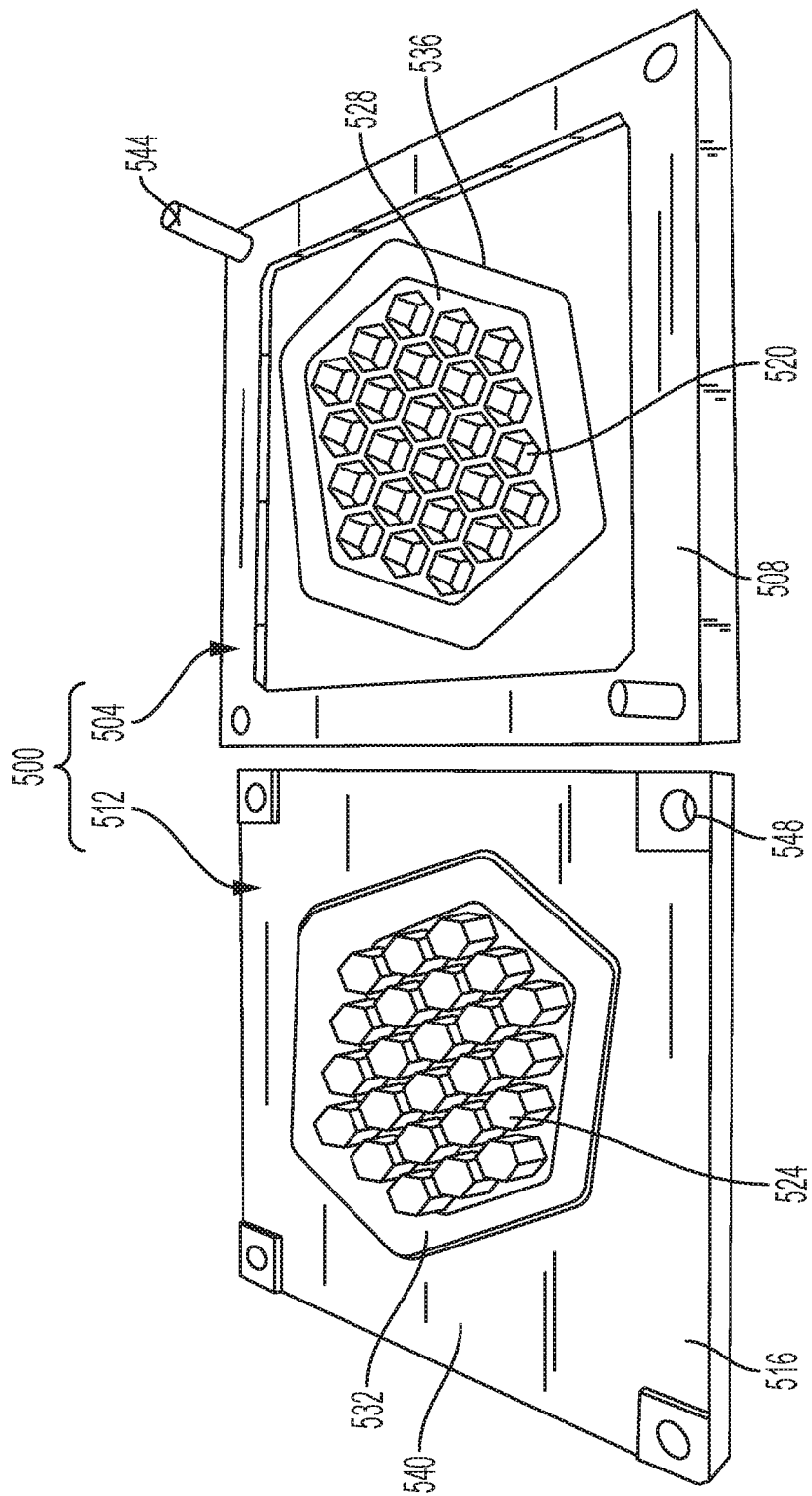
FIG. 9 is a schematic view of mold components having mold cavities to form a repressed glass plate according to an exemplary embodiment of the disclosure.

FIG. 9 is a schematic view of mold components having mold cavities 520 to form a repressed glass plate 200, 200*a-c*, 200*i* according to an exemplary embodiment of the disclosure.

In some embodiments of the method, providing the plate 200, 200a-c, 200i may comprise disposing a glass sheet on a mold 500, heating isothermally the mold 500 and the sheet to a predetermined temperature, applying molding pressure, cooling, and removing the sheet from the mold 500 with wells 204, 204a-c, 204i formed in the sheet 200, 200a-c, 200i. The glass sheet may be comprised substantially of glass and the mold 500 may comprise an array of surface cavities 520. The mold 500 may have a first coefficient of thermal expansion and the sheet may have a second coefficient of thermal expansion substantially the same as the first coefficient of thermal expansion. The heating isothermally the mold 500 and the sheet to the predetermined temperature may correspond to a viscosity of about $10^5$ poises to about $10^{7.6}$ poises of the sheet. The applying molding pressure to the sheet may force the sheet to conform to the array of surface cavities 520. The cooling the sheet disposed on the mold 500 and removing the sheet from the mold 500 may result in the sheet having the array of wells 204, 204a-c, 204i corresponding to the array of surface cavities 520 in the mold 500.

The pressing element can be a vacuum that removes atmosphere from under the glass-containing sheet so that atmosphere on top of the glass-containing sheet presses the glass-containing sheet into the mold cavity 520. In the embodiments, the pressing element can be a weight, hydraulic, or mechanical load, applied to a top mold component 512.

FIG. 9 is a schematic diagram of a mold 500 having top 512 and bottom 504 components and alignment pins 544 according to an exemplary embodiment of the disclosure. The mold 500 can have top and bottom plates 512 and 504, one of which is the negative image of the other for a multi-well structure 200c, 200i. The bottom component 504 can be a female half of the mold 500 having a female mold surface 508 and the top component 512 can be a male half of the mold 500 having a male mold surface 516. The female mold surface 508 can have a well cavity 520, or a plurality of well cavities disposed in an array. The male mold surface 516 can have inverse features of the well cavity 520, such as cavity pins 524. Other features 528 on the female mold surface 508 can include dicing features, a dam 536 to guide glass distribution, and the like. The male mold surface 516 can have matching inverse features 532, such as dicing features and glass distribution control feature 540. For smaller details, for example, less than 1 mm in cross section, the feature may be only in one of the mold surfaces 508 and 516. The top 512 and bottom 504 mold components can have guide pins 544 disposed in guide holes 548 to guide the top 512 and bottom 504 mold components when pressed together at temperature with a glass sheet to be formed disposed between the mold surfaces 508 and 516.

In some methods of manufacturing the multi-well structure 200c, 200i, according to exemplary embodiments, the mold 500 can be a precision graphite mold with predetermined graphite materials adapted to different glass and physical property requirements. The glass sheet can be prepared to a predetermined size and thickness, preferably formed by the fusion draw process, but other forming techniques such as slot draw, float, rolling, or the like can be used. The glass sheet initial thickness can range from 0.5 mm to 5 mm.

The thin glass sheet can be repressed between the two nonstick molds 512 and 504, generally made of graphite. Mold materials can include non-stick materials such as graphite and boron nitride (BN). The pressing can be operated in isothermal conditions, that is, where the mold 500 and glass are at substantially the same temperature. The method can include heating isothermally the mold 500 and the sheet to a predetermined temperature, wherein the predetermined temperature corresponds to a viscosity of about $10^5$ poises to about $10^{7.6}$ poises of the glass sheet. The method can include applying molding pressure to the sheet to force the sheet to conform to the at least one surface cavity 520, holding the sheet disposed on the mold 500 under the applied pressure for about 10 to 60 minutes, cooling the sheet disposed on the mold 500, and removing the sheet from the mold 500. When removed from the mold 500, the sheet can have at least one well 204c, 204i corresponding to the at least one surface cavity 520.

The glass sheet can be preheated to a temperature corresponding to its softening point, for example, about $10^{7.6}$ poises. For glasses such as JADE™, this corresponds to a temperature of about 1025° C., whereas for PYREX™ it would correspond to about 750° C.

Uniform pressure can be applied on top mold 512 by a mechanical apparatus or a dead weight. The pressure can be, for example, $10^{-2}$ to $10^{-3}$ N/cm$^2$.

The glass sheet formed into the multi-well structure 200c, 200i can be removed from the mold 500 and additional operations such as trimming, surface polishing, and singulation can be performed.

In contemplated embodiments, the flexible substrate is positioned between the electrodes thereon and liquids in the well, whereby the substrate itself serves to isolate the electrodes from the liquids. In some such embodiments, the substrate is or comprises dielectric materials, such as a polymer or composite having a dielectric constant of from about 1.5 to about 10 and a breakdown voltage property of about 1500 volts per micron.

Conventional techniques may be used for polishing the surfaces. Coarse grinding may generally not be necessary when the mold surfaces were well finished. Hand polishing or double sided lap polishing may be accomplished on conventional grinding and polishing machines using free abrasive powder (SiC) for grinding and cerium oxide on a polyurethane pad for polishing.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A circuit for a liquid lens system, comprising:
   a flexible substrate comprising a polymer having a flexural strength, according to ASTM D790, of less than 300 MPa, wherein the flexible substrate has a longitudinal portion extending lengthwise and a wing portion disposed on the longitudinal portion, wherein the wing portion extends transverse to the longitudinal portion;
   a first electrode and a second electrode bonded to the wing portion; and
   electrical connectors bonded to the longitudinal portion of the flexible substrate and electrically coupled to the first and second electrodes, whereby the circuit may connect the first electrode and the second electrode to a controller for manipulating liquids of the liquid lens system.

2. The circuit of claim 1, wherein the first electrode is an independent control electrode and the second electrode is a common electrode.

3. The circuit of claim 2, wherein the first electrode is closer to the longitudinal portion than the second electrode.

4. The circuit of claim 1, wherein the wing portion of the flexible substrate is partitioned from the longitudinal portion by a fold.

5. The circuit of claim 4, wherein the wing portion is oriented at least 15-degrees below a plane defined by the longitudinal portion adjacent to the fold.

6. The circuit of claim 1, wherein the substrate comprises at least two wing portions extending on opposite sides of the longitudinal portion from one another.

7. The circuit of claim 1, wherein the first and second electrodes are inter-digitated.

8. A liquid lens system, comprising:
    a plate comprising a first major surface and a second major surface opposite the first major surface, and an array of wells having inner surfaces extending inward from the first major surface to a well depth, the wells having outer surfaces extending outward from the second major surface to form a well underside;
    a flexible-substrate circuit comprising:
        a substrate comprising a longitudinal portion disposed on the first major surface of the plate, and a wing portion extending transverse to the longitudinal portion, wherein the wing portion extends into a well of the array of wells and is disposed on a wall of the well,
        a first electrode and a second electrode on the wing portion of the substrate and located in the well;
        connectors on the longitudinal portion of the substrate and overlaying the first major surface of the plate; and
    a controller, wherein the first electrode and the second electrode are electrically connected to the controller by way of the connectors on the longitudinal portion.

9. The system of claim 8, wherein the first electrode is an independent control electrode and the second electrode is a common electrode.

10. The system of claim 9, wherein the first electrode is closer to the longitudinal portion than the second electrode.

11. The system of claim 10, wherein the wing portion of the flexible substrate is partitioned from the longitudinal portion by a fold, and wherein the fold overlays an edge of the well.

12. The system of claim 11, wherein the wing portion is oriented at least 15-degrees below a plane defined by the longitudinal portion adjacent to the fold.

13. The system of claim 8, wherein the first electrode and the second electrode are inter-digitated in the wing portion.

14. The system of claim 8, wherein the substrate comprises multiple wing portions that extend into different wells of the array of wells from one another.

15. The system of claim 8, wherein the flexible substrate comprises a polymer having a flexural strength, according to ASTM D790, of less than 300 MPa.

16. The system of claim 8, wherein the flexible substrate is positioned such that light can pass through the underside of the well and an opening at a top of the plate.

17. The system of claim 16, further comprising a first liquid and a second liquid disposed in the well, the first and second liquids being non-miscible, of different optical indexes and of substantially same density, the first liquid being conductive, the second liquid being insulating; and a transparent cover disposed on a top surface of the plate on the first major surface.

18. The system of claim 17, further comprising an insulation layer disposed the first and second electrodes, between the first and second electrodes and the first and second liquids.

19. A method of making a liquid lens system, the method comprising:
    providing a plate comprising a first major surface and a second major surface opposite the first major surface, and an array of wells having inner surfaces extending inward from the first major surface to a well depth, and the wells having outer surfaces extending outward from the second major surface to form a well underside;
    disposing a longitudinal portion of a flexible-substrate circuit on a first major surface of a plate, adjacent to a well of the plate, wherein the flexible-substrate circuit comprises a wing portion extending transverse to the longitudinal portion, and wherein the wing portion comprises a first electrode and a second electrode;
    disposing the wing portion into the well;
    bonding the wing portion to a wall of the well; and
    electrically connecting, via connectors on the longitudinal portion, the first electrode and the second electrode to a controller.

20. The method of claim 19, further comprising adding a first liquid and a second liquid to the at least one well, the first liquid being conductive and contacting the first electrode, the second liquid having an interface with the first liquid, the second liquid being insulating, the first and second liquids being non-miscible; and
    hermetically sealing the well with a conductive path through the hermetic seal.

* * * * *